United States Patent
Nagano

[11] Patent Number: 6,006,701
[45] Date of Patent: Dec. 28, 1999

[54] VAPORIZER IN A LIQUID MATERIAL VAPORIZING AND FEEDING APPARATUS

[75] Inventor: Katsuhisa Nagano, Akishima, Japan

[73] Assignee: Aera Japan Ltd, Tokyo, Japan

[21] Appl. No.: 09/222,287

[22] Filed: Dec. 28, 1998

[30] Foreign Application Priority Data

May 11, 1998 [JP] Japan ................................. 10-142075

[51] Int. Cl.$^6$ .................................................. F22B 23/06
[52] U.S. Cl. ...................................... 122/367.1; 118/726
[58] Field of Search ............................. 122/367.1, 406.4; 118/726

[56] References Cited

U.S. PATENT DOCUMENTS

| | | | |
|---|---|---|---|
| 3,651,805 | 3/1972 | Breiling | 128/203.25 |
| 5,865,421 | 2/1999 | Ono | 251/129.02 |

*Primary Examiner*—Mark Paschall
*Assistant Examiner*—Gregory A. Wilson
*Attorney, Agent, or Firm*—Lightbody & Lucas

[57] ABSTRACT

It is intended to provide a vaporizer in a liquid material vaporizing and feeding apparatus for allowing a liquid to absorb heat efficiently and vaporizing it thereby without pulsation of the liquid or formation of air bubbles.

In a lower end face of an upper member 20 is formed a recess 24 into which a liquid material inlet 22 opens, and a valve member 50 is disposed so as to cover the recess 24.

With a spring S, the valve member 50 is urged in a direction in which it comes into close contact with the lower end face of the upper member 20. A vaporizing portion 26 is formed between an upper surface of the valve member 50 and the upper member 20, and a pressure intensifying portion 58 is formed by both the upper surface of the valve member 50 and the recess 24.

A liquid material fed from the liquid material inlet 22 depresses the valve member 50 through the pressure intensifying portion 58, and when the liquid material is diffused in the vaporizing portion 26, it is heated and vaporizes in an instant.

7 Claims, 3 Drawing Sheets

FIG.1A
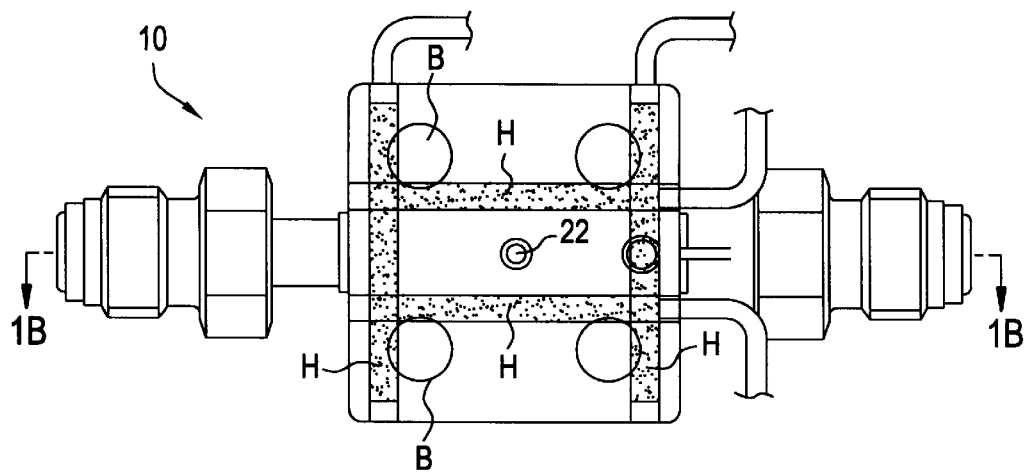
FIG.1B
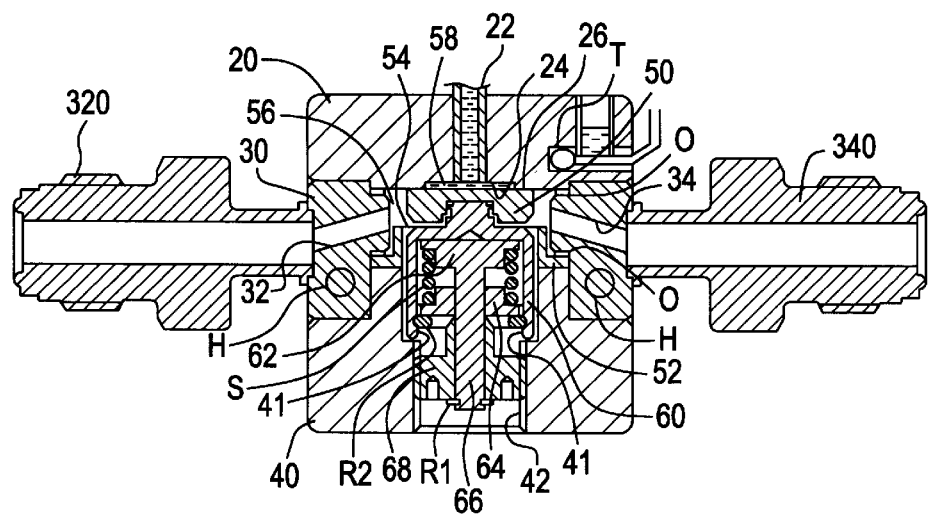
FIG.1C

VAPORIZER IN A LIQUID MATERIAL VAPORIZING AND FEEDING APPARATUS

FIELD OF THE INVENTION

The present invention pertains to the technical field of vaporizers used in liquid material vaporizing and feeding apparatus for feeding a special liquid-vaporized gas to a semiconductor manufacturing line or the like.

BACKGROUND OF THE INVENTION

In a manufacturing process for a semiconductor device or the like, a film forming material such as, for example, vaporized tetraethoxysilane (TEOS) is deposited on a substrate to form a thin film in accordance with the chemical vapor deposition (CVD) method for example.

The said film forming material, from the standpoint of safety, etc. in handling the material, is fed as liquid into the apparatus, then only a required amount of the liquid thus fed is heat-vaporized in the vaporizer mounted in the interior of the apparatus, and is then fed to a semiconductor manufacturing line or the like.

In Japanese Published Unexamined Patent Application No. Hei 7-230841 is described a vaporizer in a conventional liquid material vaporizing and feeding apparatus.

The said vaporizer is disposed on a single body block together with a gas flow controller and is provided with a valve portion which is moved up and down by means of a piezostack. A liquid material is vaporized by both drop in liquid pressure which occurs when the liquid material flows into a vaporizing chamber and heating with a cartridge heater.

There also is known a liquid material vaporizing and feeding apparatus in which a flow controller and a vaporizer are formed separately and connected together through a pipe.

In connection with the structure of vaporizer there are known, for example, a structure in which a carrier gas with a liquid material mixed therein is jetted from a nozzle and the thus atomized liquid material is vaporized by heating, and a structure in which a liquid material is vaporized by contact thereof with laminated discs or beads heated to a high temperature.

OBJECTS AND SUMMARY OF THE INVENTION

However, the liquid material vaporizing and feeding apparatus disclosed in Japanese Published Unexamined Patent Application No. Hei 7-230941 involves the problem that since the vaporizer and the gas flow controller are integral with each other, a heat-sensitive resistor used as a sensor in the gas flow control portion is influenced by the heat generated from the heater, thus making it difficult to effect an accurate detection of flow rate.

Moreover, a thermal influence on a valve driving mechanism in the gas flow control portion must be taken into account, and with the heater used in the above vaporizer it is impossible to conduct heating above a heat-resistant temperature (about 150° C.) of the valve driving mechanism.

Further, since the conventional vaporizer in question is of a structure in which a liquid material is directly heated to vaporize, there may occur pulsation or air bubbles when the temperature of the liquid material becomes high.

In the foregoing conventional vaporizer in which an atomized liquid material is heated and the vaporizer in which a liquid material is brought into contact with a portion held at a high temperature, the dead volume of liquid material is large and there also exists a problem such that the response characteristic to instructions given from the control portion such as the stop of gas generation and a change in the amount of gas to be generated, is poor.

BRIEF DESCRIPTION OF THE DRAWINGS

FIG. 1 illustrates a vaporizer according to the first embodiment of the present invention, in which (a) is a top view, (b) is a longitudinal sectional view taken on line b—b in (a), and (c) is an enlarged, longitudinal sectional view of a pressure intensifying portion;

MEANS FOR SOLVING THE PROBLEMS

Figure 2:
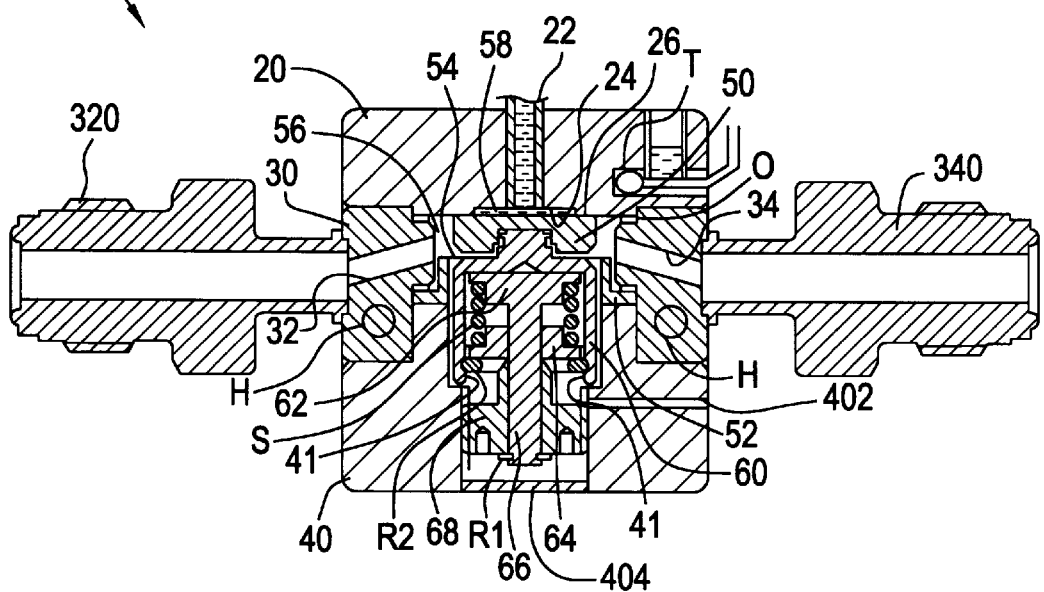
FIG. 2 is a longitudinal sectional view of a vaporizer according to the second embodiment of the present invention.

The present invention has solved the above-mentioned problems by means of a vaporizer in a liquid material vaporizing and feeding apparatus provided with a liquid material inlet, a gas outflow passage and a heating means, the vaporizer comprising:

an upper member formed with the liquid material inlet, an intermediate member formed with the gas outflow passage, and a lower member formed with an opening, wherein a recess, into which the liquid material inlet opens, is formed in a central lower end face of the upper member, a valve member is disposed within the intermediate member in such a manner that the valve member is opposed to and cover the recess, a vaporizing portion is formed by a contact portion between an upper surface of the valve member and the central lower end face of the upper member, and an urging means is disposed within the opening of the lower member to urge the valve member in a direction in which the valve member comes into close contact with the central lower end face of the upper member.

As described in claim 2, the upper member and the intermediate member, or the intermediate member and the lower member, may be integral with each other.

As described in claim 3, if the urging means comprises a spring, an upper spring holding member and a lower spring holding member, and if the lower spring holding member is movable in directions in which the spring expands and retracts, the magnitude of the urging force to be applied to the valve member can be adjusted and thus this construction is preferable.

Further, as described in claim 4, if the lower member has a pressure regulating hole and a closure member for closing the opening of the lower member, it is also possible to adjust the magnitude of the urging force to be applied to the valve member. The urging gas may be sealed, as described in claim 6.

OPERATION

The liquid material fed is diffused in the vaporizing portion and its surface area thereby increases remarkably, so that the liquid material absorbs heat efficiently and vaporizes in an instant.

Further, since the valve member is urged with the spring in a direction in which it comes into close contact with the upper member, the pressure of the liquid material present in the pressure intensifying portion is held at a certain level or higher.

MODE FOR CARRYING OUT THE INVENTION

FIG. 1 illustrates a vaporizer 10 according to the first embodiment of the present invention, in which (a) is a top view, (b) is a longitudinal sectional view taken on line b—b in (a), and (c) is partially enlarged, longitudinal section view of a pressure intensifying portion of the vaporizer 10 which portion will be described later.

Positions of heaters H mounted in the interior of the vaporizer 10 are also shown in FIG. 1(*a*).

The vaporizer 10 comprises an upper member 20 having a liquid material inlet 22, an intermediate member 30 formed with both a gas outflow passage 32 and an assist gas feed passage 34, and a lower member 40 formed with an opening 42 (see FIG. 1(*b*). The upper member 20, intermediate member 30 and lower member 40 are laminated together and then fixed into an integral body with bolts B or the like.

Thus, the vaporizer 10 of this embodiment comprises the upper member 20, intermediate member 30 and lower member 40, but it is not always required that the vaporizer comprise all of these three members. The upper member 20 and the intermediate member 30, or the intermediate member 30 and the lower member 40, may be formed integrally if it is possible from the structural viewpoint. In this case, the positions of O-rings for the prevention of gas leak differ as a matter of course. But the illustration of such a mode of embodiment is here omitted.

In the interior of the vaporizer 10 is formed a vaporizing chamber 56 which is enclosed with the upper member 20, the intermediate 30, a valve member 50, a diaphragm 54 and a flange 52 of an L-shaped section. The gas present within the vaporizing chamber 56 flows from the gas outflow passage 32 in the intermediate member 30 to an outflow-side joint 320.

Into the vaporizing chamber 56 is fed a stable and low-reactive carrier gas such as, for example, helium from an assist gas feed portion (not shown) through an assist gas joint 340 and the assist gas feed passage 34 formed in the intermediate member 30.

The flange 52 and the diaphragm 54 are formed integrally with each other and o-rings 0, 0 are disposed respectively between the upper member 20 and the intermediate member 30 and between the intermediate member 30 and the flange 52, so that the interior of the vaporizing chamber 56 is kept airtight to prevent the leakage of vaporized gas to the exterior.

In the lower end face of the upper member 20 is formed a recess 24 into which the liquid material inlet 22 opens, and the valve member 50 is disposed so as to cover the recess 24. A pressure intensifying portion 58 to be described later is formed by both the recess 24 in the upper member 20 and the upper surface of the valve member.

The underside of the valve member 50 is in contact with a projecting portion of a spring holder 60 through the diaphragm 54, and a spring S is held between two spring holding members 62 and 64 disposed within the spring holder 60.

Between the lower end portion of the spring holder 60 and a shoulder portion 41 of the lower member 40 is formed a gap of about 0.2 to 0.3 mm.

The upper spring holding member 62 is formed integrally with a shaft 66 which extends through central portions of both the lower spring holding member 64 and an adjusting screw 68 and which is supported in an axially slideable manner.

A stop ring R1 is provided on the lower end portion of the shaft 66, so even if the shaft 66 slides axially with respect to the adjusting screw and the lower spring holding member 64, the shaft never comes off the adjusting screw 68.

The lower spring holding member 64 is urged downward into pressure contact with the adjusting screw 68 by an urging force of the spring S.

The adjusting screw 68 is movable vertically and the positioning of the lower spring holding member 64 is effected on the basis of a fixed position of the adjusting screw 68. In this way it is possible to adjust the urging force of the spring.

The spring holder 60 is provided with a stop ring R2 to prevent the lower spring holding member 64 from coming off the spring holder 60.

The vaporizer 10 is provided with heaters H and a thermometer T. The whole of the vaporizer 10 is heated beforehand to a predetermined temperature.

The upper member 20, intermediate member 30 and the lower member 40 as constituents of the vaporizer 10 are constituted using a material of high thermal conductivity, thus ensuring a high thermal efficiency. The whole of the vaporizer 10 is held at approximately the same temperature by heating with the heaters H. For measuring the temperature of a vaporizing portion 26 to be described later, the thermometer T is disposed in the vicinity of the vaporizing portion 26.

The vaporizer 10 is formed using a material of high heat resistance so as to be employable even under heating to a high temperature of about 200° C. with the heaters H.

The temperature of the vaporizer 10 is set appropriately in accordance with such conditions as the kind and flow rate of the liquid material used and the pressure of gas to be generated.

The heaters H are disposed at the positions shown in FIG. 1(*a*) and are buried in the interior of the intermediate member 30 as shown in FIG. 1(*b*).

The positions and the number of heaters H are not limited to the above ones insofar as the whole of the vaporizer 10 can be heated efficiently.

Figure 4:
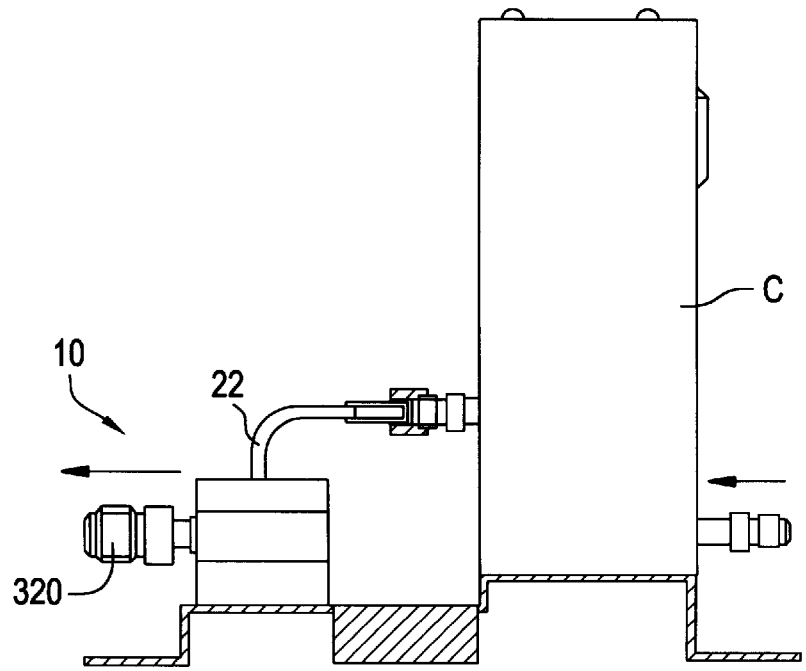

FIG. 4 is an entire view of a liquid material vaporizing and feeding apparatus comprising a vaporizer 10 according to the present invention and a conventional mass flow controller C for liquid connected thereto.

The vaporizer 10 shown in FIG. 4 is not provided with an assist gas feed passage.

The construction of the mass flow controller C for liquid is the same as in the prior art and therefore an explanation thereof is here omitted.

The operation of the vaporizer 10 according to the present invention will be described below with reference to FIG. 1(*b*) and FIG. 4.

In this vaporizer 10, the adjusting screw 68 is positioned beforehand at a predetermined position so that a predetermined urging force is imparted to the valve member 50 by the spring S. The vaporizer 10 is heated and held at a preset temperature by the heaters H disposed in the interior of the vaporizer.

A liquid material flow rate is adjusted by the liquid mass flow controller C and then flows into the pressure intensifying portion 58 through the liquid material inlet 22.

As the internal pressure of the pressure intensifying portion 58 increases gradually with inflow of the liquid material in the pressure intensifying portion 58 and the liquid pressure exerted on the valve member 50 becomes larger than the urging force of the spring S, the valve member 50 moves downward against the urging force of the spring S and the liquid material flows out into the vaporizing portion 26 defined by a slight gap between the valve member 50 and the underside of the upper member 20. The pressure in this outflow of the liquid material is set at, say, 1.7–1.9 kg/cm$^2$ by the spring S.

The liquid material present within the vaporizer 26 is not compressed but is diffused in a state of gap flow, so that its surface area increases rapidly.

Consequently, the quantity of heat which a unit amount of the liquid material diffused in the vaporizing portion 26 absorbs also increases rapidly and at the same time the internal pressure of the pressure intensifying portion 58 decreases with a downward movement of the valve member 50. As a result, when the liquid material passes through the vaporizing portion 26, it vaporizes in an instant.

The vaporized gas is carried by the assist gas to the outflow-side joint 320 from the interior of the vaporizing chamber 56.

The valve member 50 is required to be given as large an urging force as possible by the spring S to fulfill the function of coming into close contact with the upper member 20 when the liquid material is not fed and thereby surely preventing the leakage of the liquid material into the vaporizing chamber 56.

For depressing the valve member 50 against such a large urging force, the pressure intensifying portion 58 if provided to increase a downward force created by the internal pressure of the liquid material.

With reference to FIG. 1(c) which is partially enlarged sectional view of the pressure intensifying portion 58 defined by both the recess 24 of the upper member 20 and the valve member 50, a description will be given below of conditions for passage of the liquid material through the vaporizing portion 26.

In the same figure, the reference mark A stands for the diameter of the pressure intensifying portion 58.

A depressing force F1 of the liquid present in the pressure intensifying portion 58 for depressing the valve member 50 is represented by the equation F1=P1×S1 as the product area S1 of the pressure intensifying portion 58 and an internal liquid pressure P1 of the pressure intensifying portion 58.

On the other hand, an upward urging force F2 applied to the valve member 50 is the sum of the urging force of the spring S and the atmospheric pressure applied thereto through the opening 42 of the lower member 40 which is in communication with the exterior. With F1 larger than F2, the liquid material can pass through the vaporizing portion 26.

If F1 is set at approximately 0.7–0.9 kgf and P1 is set at approximately 1.7–1.9 kg/cm$^2$, then for satisfying the relation of F1>F2, the area S1 of the pressure intensifying portion 58 is about 0.444 cm$^2$.

Therefore, the diameter A of the pressure intensifying portion 58 to permit passage of the liquid material through the vaporizing portion 26 is about 8 mm.

On the other hand, in the case where the reaction process is under the condition of reduced pressure and the internal pressure of the vaporizing chamber 56 is lower than the atmospheric pressure, not only the urging force of the spring S but also an upward urging force based on the atmospheric pressure is applied to the valve member 50 through the diaphragm 54 from the opening 42 which is in communication with the exterior.

In this case, the urging force based on the atmospheric pressure is presumed to be a maximum of about 2.1 kgf. If such a large urging force is applied to the valve member 50 on which has already been exerted the urging force of the spring S, the urging force as a whole applied to the valve member 50 becomes too strong, which may result in the liquid material being no longer able to pass through the vaporizing portion 26.

In such a case, if the adjusting screw 68 is moved downward, the shaft 66 moves downward through the stop ring R1, whereby the spring S is compressed by the upper spring holding member 62 and the lower spring holding member 64 is urged downward, with the result that the diaphragm 54 is pulled downward by the stop ring R2 to adjust the urging force of the spring S appropriately.

In this way it is possible to let the urging force of the spring S act in both upward and downward directions.

FIG. 2 is a sectional view of a vaporizer 100 according to the second embodiment of the present invention.

In FIG. 2, the same reference numerals as in FIG. 1(b) represent the same components as in FIG. 1(b).

The vaporizer 100 is different from the vaporizer 10 of the first embodiment in that a lower member 40 used therein has a pressure regulating hole 402 in communication with the exterior and a closure member 404 for covering the opening 42.

Other construction points are the same as in the first embodiment and therefore explanations thereof will be omitted.

In this second embodiment, the opening 42 is closed with the closure member 404 and a gas such as air is fed to the interior through the pressure regulating hole 402 to increase the internal pressure, whereby a stronger urging force can be applied to the valve member 50.

Figure 3:
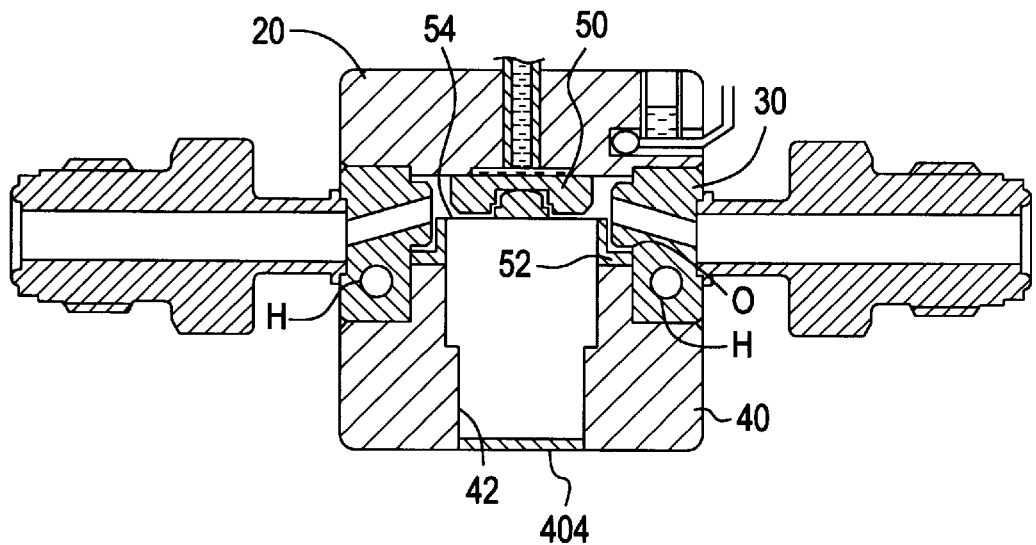
FIG. 3 is a longitudinal sectional view of a vaporizer according to the third embodiment of the present invention; and, FIG. 4 is an entire view of a liquid material vaporizing and feeding apparatus using a vaporizer according to the present invention.

FIG. 3 is a sectional view of a vaporizer 102 according to the third embodiment of the present invention, in which the interior of the opening 42 in the lower member 40 is filled with a gas of a certain pressure and the opening 42 is closed with the closure member 404.

In this embodiment, the urging means using spring S is not provided, but the valve member 50 is urged upward through the diaphragm 54 by the pressure of the gas filled into the interior of the opening 42.

Other constructional points are the same as in the first and second embodiments, so explanations thereof will be omitted.

In the vaporizers 10, 100 and 102 according to the present invention illustrated in FIGS. 1, 2 and 3, respectively, it is not always necessary to feed an assist gas, which may be a purging gas, into the vaporizing chamber 56. Where the assist gas is not fed, it is unnecessary to form the assist gas feed passage 34 in the intermediate member 30.

The area of the vaporizing portion 26 defined by both the upper surface of the valve member 50 and the lower surface of the upper member 20 can be set approximately by changing such conditions as the kind of liquid material and vaporization efficiency.

Further, the urging force to be applied to the valve member 50 can be adjusted by moving the adjusting screw 68 vertically.

It is desirable that a closing valve be mounted in the liquid material inlet 22 to prevent the leakage of liquid material to the vaporizer side and thereby enhance the reliability of the device.

EFFECT OF THE INVENTION

Since the vaporizer according to the present invention is of a construction in which a liquid material is diffused in a slight gap as a vaporizing portion, there is attained an effect such that the liquid material absorbs heat efficiently and is vaporized in an instant.

To be more specific, when the liquid material is diffused in the vaporizing portion, the valve member moves downward slightly, whereby the liquid pressure in the pressure intensifying portion is reduced immediately and hence the liquid material is vaporized in an instant.

According to the present invention, moreover, since the valve member is urged upward, the pressure of the liquid material present in the pressure intensifying portion and the liquid material inlet is held at a certain level or higher, so that there is no fear of formation of air bubbles in the liquid material in the liquid material inlet or pulsation of the liquid material, and the effect of stable feed of the liquid material is attained.

Since the liquid material is incompressible, an increase of pressure on the upstream side is immediately propagated to the pressure intensifying portion and the valve member can be operated thereby. Thus, a high response characteristic is attained.

Further, by using an adjusting screw and changing the position thereof to adjust the urging force to be applied to the valve member, it is possible to effect vaporization of a liquid material in the most suitable condition according to the kind of the liquid material used and vaporizing conditions.

Additionally, if the whole of the vaporizer is formed using a material of high heat resistance and high heat conductivity, the vaporizer can be used even at a high temperature without impairment of its function.

Although the invention has been set forth in its preferred embodiment, it is to be understood that numerous changes may be made without deviating from the invention as hereinafter claimed.

What is claimed:

1. A vaporizer in a liquid material vaporizing and feeding apparatus provided with a liquid material inlet, a gas outflow passage and a heating means, said vaporizer comprising:

an upper member formed with said liquid material inlet, and intermediate member formed with said gas outflow passage, and a lower member formed with an opening, wherein a recess, into which said liquid material inlet opens, is formed in a central lower end face of said upper member, a valve member is disposed within said intermediate member in such a manner that said valve member is opposed to and cover said recess, a vaporizing portion is formed by a contact portion between an upper surface of said valve member and the central lower end face of said upper member, and an urging means is disposed within said opening of said lower member to urge said valve member in a direction in which the valve member comes into close contact with the central lower end face of said upper member.

2. A vaporizer in a liquid material vaporizing and feeding apparatus according to claim 1, wherein said upper member and said intermediate member, or said intermediate member and said lower member, are formed integrally with each other.

3. A vaporizer in a liquid material vaporizing and feeding apparatus according to claim 1 or claim 2, wherein said urging means comprises a spring, an upper spring holding member and a lower spring holding member, said lower spring holding member being movable in directions in which said spring expands and retracts.

4. A vaporizer in a liquid material vaporizing and feeding apparatus according to any of claims 1 or 2, wherein said lower member has a pressure regulating hole which is in communication with the exterior and also has a closure member for closing said opening.

5. A vaporizer in a liquid material vaporizing and feeding apparatus according to claim 4, wherein said intermediate member has an assist gas feed passage.

6. A vaporizer in a liquid material vaporizing and feeding apparatus according to any of claims 1 or 2, wherein said intermediate member has an assist gas feed passage.

7. A vaporizer in a liquid material vaporizing and feeding apparatus according to claim 1 or claim 2, wherein said urging means comprises a closure member for closing said opening of said lower member and a gas sealed in the interior.

* * * * *